United States Patent
De Schoulepnikoff

(10) Patent No.: US 9,925,762 B2
(45) Date of Patent: Mar. 27, 2018

(54) METHOD FOR THE MEASUREMENT OF THE VOLUMETRIC CAPACITY OF A TEXTURED SURFACE AND DEVICE FOR PERFORMING THE METHOD

(71) Applicant: Laurent De Schoulepnikoff, Nyon (CH)

(72) Inventor: Laurent De Schoulepnikoff, Nyon (CH)

( * ) Notice: Subject to any disclaimer, the term of this patent is extended or adjusted under 35 U.S.C. 154(b) by 184 days.

(21) Appl. No.: 15/026,415

(22) PCT Filed: Oct. 1, 2013

(86) PCT No.: PCT/CH2013/000175
§ 371 (c)(1),
(2) Date: Mar. 31, 2016

(87) PCT Pub. No.: WO2015/048913
PCT Pub. Date: Apr. 9, 2015

(65) Prior Publication Data
US 2016/0250843 A1    Sep. 1, 2016

(51) Int. Cl.
*G01F 17/00* (2006.01)
*B41F 33/00* (2006.01)
(Continued)

(52) U.S. Cl.
CPC .......... *B41F 33/0063* (2013.01); *B41F 33/00* (2013.01); *G01F 17/00* (2013.01); *G01R 33/07* (2013.01); *G01F 22/00* (2013.01)

(58) Field of Classification Search
CPC ......... G01F 17/00; G01F 22/00; G01R 33/07; B41F 33/0063
(Continued)

(56) References Cited

U.S. PATENT DOCUMENTS 3,931,570 A    1/1976  George et al.
4,628,728 A   12/1986  Taylor et al.
(Continued)

FOREIGN PATENT DOCUMENTS

DE    10051736 A1   5/2002
DE    10154348 A1   5/2003
(Continued)

OTHER PUBLICATIONS

International Search Report for PCT/CH20123/000175, ISA/EP, Rijswijk, NL, dated Aug. 18, 2014.

*Primary Examiner* — Benjamin Schmitt
(74) *Attorney, Agent, or Firm* — Brooks Kushman P.C.

(57) ABSTRACT

The invention concerns a method and a device for the measurement of the volumetric capacity of a textured surface, especially a ceramic-coated laser-engraved metering roll, also called anilox roll, which is mainly used in the flexographic printing process, said metering roll comprising a plurality of cells designed to receive a predetermined quantity of a liquid, preferably ink, glue, varnish or a similar product to be transferred on the surface of a support. A ferrofluid is applied in the cells that compose the anilox roll surface, a magnetic field is generated close to the roll surface, the intensity of the magnetic field, increased by the ferrofluid, is measured and the volumetric capacity of the anilox roll is determined by measuring the increase in the magnetic field due to the presence of the ferrofluid.

19 Claims, 3 Drawing Sheets

(51) Int. Cl.
  *G01R 33/07* (2006.01)
  *G01F 22/00* (2006.01)
(58) Field of Classification Search
  USPC .............................................. 73/149; 324/228
  See application file for complete search history.

(56) References Cited

U.S. PATENT DOCUMENTS

| | | | |
|---|---|---|---|
| 4,859,943 A * | 8/1989 | Evans | ................... G01N 27/84 |
| | | | 324/216 |
| 5,235,851 A | 8/1993 | Jones | |
| 5,370,052 A | 12/1994 | Reslow | |
| 5,438,864 A | 8/1995 | Morgan | |
| 6,308,623 B1 | 10/2001 | Schonberger et al. | |
| 2004/0118180 A1 | 6/2004 | Keating | |

FOREIGN PATENT DOCUMENTS

| | | | |
|---|---|---|---|
| FR | 1540970 A | 10/1968 | |
| FR | 2669419 A1 | 5/1992 | |
| GB | 1118508 A | 7/1968 | |
| JP | H07-148914 A | 6/1995 | |
| WO | WO-9011188 A1 | 10/1990 | |
| WO | WO-2010/055320 A1 | 5/2010 | |

* cited by examiner

METHOD FOR THE MEASUREMENT OF THE VOLUMETRIC CAPACITY OF A TEXTURED SURFACE AND DEVICE FOR PERFORMING THE METHOD

CROSS-REFERENCE TO RELATED APPLICATIONS

This application is a 371 U.S. National Stage of International Application No. PCT/CH2013/000175, filed Oct. 1, 2013, and published in English on Apr. 9, 2015 as WO 2015/048913 A1. The entire disclosures of the above application are incorporated by reference herein.

TECHNICAL FIELD

The present invention relates to a method for the measurement of the volumetric capacity of a textured surface, especially a ceramic-coated laser-engraved metering roll, also called anilox roll, which is mainly used in the flexographic printing process, said metering roll comprising a plurality of cells designed to receive a predetermined quantity of ink, glue, varnish or a similar product to be transferred on the surface of a support.

The present invention relates further to a device for performing the above method for the measurement of the volumetric capacity of a textured surface, especially a ceramic-coated laser-engraved metering roll, also called anilox roll, which is mainly used in the flexographic printing process, said metering roll comprising a plurality of cells designed to receive a predetermined quantity of ink, glue, varnish or a similar product to be transferred on the surface of a support.

BACKGROUND ART

Various printing techniques use a roll, usually named "anilox roll" or "metering roll", for the purpose of supplying a calibrated amount of ink to another roll or to the substrate to be printed. The main applications of the anilox roll are described below:

In the flexography and offset printing techniques the anilox roll brings the calibrated amount of ink to another roll, named "plate roll", which contains the image to be printed, and which in turn will print the image to the substrate, which can be for example a ribbon of paper, plastic foil, or carton board.

In the gravure printing technique the anilox roll brings the calibrated amount of ink directly to the substrate, which can be for example a ribbon of paper, plastic foil, or carton board. Similarly, in other industries the anilox roll is used for bringing a calibrated amount of e.g. glue, varnish, to a substrate.

All these applications have in common the requirement for the anilox roll to deliver an amount of liquid, like ink, varnish, glue, that must be precisely calibrated, otherwise the print quality is adversely affected.

An anilox roll is composed of a textured surface, made of cells or grooves, which are filled with a liquid, e.g. ink, during the printing process. This arrangement of cells, named "engraving", is nowadays engraved with a tightly focused laser beam in a ceramic coating, usually made of thermally sprayed chrome oxide. The ceramic coating usually lies on an intermediate coating, usually made of thermally sprayed nickel-chrome, which serves both as an anticorrosion barrier and a bond between the ceramic coating and the base material. The base material is usually made either of steel or aluminum.

The quantity of liquid that the engraving of an anilox roll can carry, named "volumetric capacity", represents one of the key factors determining the quantity of liquid that is transferred to the plate roll, and finally to the substrate. The other important factors affecting the transfer rate of the anilox roll are among others the liquid properties especially the viscosity and the surface tension, the pressure of the anilox roll to the plate roll or to the substrate, the machine speed, or in other terms the rotation rate of the anilox roll. An incorrect volumetric capacity of the anilox roll may come from dirtiness lying in the bottom of the cells, e.g. dried ink, wear of the ceramic coating, or incorrect manufacturing of the anilox roll. The volumetric capacity is measured as the quantity of liquid that a unit surface of the roll can carry, the usual units being $cm^3/m^2$ and $BCM/inch^2$, in which BCM meaning billion cubic micrometer.

The usual method to measure the volumetric capacity of an anilox roll follows the principle described by the patent U.S. Pat. No. 4,628,728A: a small amount of colored ink, e.g. 10 microliters, is applied with a precision micropipette on the roll surface, the said ink is spread with a doctor blade which is a steel blade of typically 0.15 mm thickness, so that the cells of the engraving are precisely filled with the ink to their top, the surface of the ink blot on the roll is imaged on a foil of paper or plastic, the area of the said surface is measured with a planimeter or a scanner. This method requires a precisely calibrated micropipette and planimeter, and trained operator in order to apply and spread the ink in a way that is repeatable. Moreover the liquid rheology, e.g. surface tension and viscosity, must be adapted to the size of the cells and surface tension of the ceramic in order to correctly fill the cells. This method is not well suited to a printing shop due to the fact the components are fragile and the operator must be specially trained for that method of measurement. The precision of this method typically lies between +/−5% and +/−10%.

A variant of the method described in U.S. Pat. No. 4,628,728A is the object of U.S. Pat. No. 5,235,851: the measurement liquid is forced through a channel of a transparent strip, which is applied on the roll surface to be measured. The length in the channel reached by the liquid is inversely proportional to the volumetric capacity. This method is easier and quicker to implement compared with the former described method, however, it is less precise.

A third method to measure the volumetric capacity of anilox roll proceeds with a light interferometer, e.g. patent DE-101,54,348-A1: light is focused through a microscope objective onto the roll surface, the light reflected from the walls of the cells is reflected back to the microscope and compared with the light sent by the microscope. The distance of the portion of the wall onto which the light was focused is deduced. By scanning the focused light down the cell to its bottom a three-dimensional image of the cells is obtained, from which the volumetric capacity can be computed. This method has the drawbacks of being expensive and not fully reliable: the surface of the chrome oxide ceramic that is usually used in anilox rolls is dark, and hence a small portion of light is reflected back, which negatively influences the instrument precision.

A fourth method, disclosed in patent U.S. Pat. No. 5,438,864, applies a fluorescent fluid on the roll surface to be measured, ultraviolet light is directed towards the said fluid, and the fluorescent light emitted by the said fluid is measured by the instrument. The volumetric capacity of the roll is linked to the amount of fluorescent light detected.

This method has the advantage of using a quantity of measurement fluid that does not need to be calibrated, on the contrary of the two first methods previously described, but the instrument precision is poor due to the fact that the amount of fluorescent light emitted is dependent on the shape of the cells being pyramid-shaped or bowl-shaped, as well as the color of the ceramic, e.g. light grey or dark grey.

A fifth method is described in patent JP-7,148,914-A: a contact finger is sensing the depth of the point of contact, the cell profile is then deduced from a scan of the contact finger along the surface. This method is not applicable for most anilox rolls used nowadays, as the cell diameter is too small, 10 to 50 microns, for the contact finger to reach the cell walls.

Some processes get around the measurement of the volumetric capacity by modifying this volumetric capacity during the printing process, in order to reach the desired quantity of liquid transferred from the roll: e.g. U.S. Pat. No. 5,370,052 and U.S. Pat. No. 6,308,623-B1. Neither of these methods has proved precise nor reliable.

Considering the above, there is the need for a method which is precise, reliable, and easy to use in an industrial environment. The implementation of such a method would allow the printer to monitor the efficiency of his anilox rolls, and hence gain control of one key parameter of the printing process.

Other methods for measuring the volumetric capacity of rotogravure chrome-plated rolls are known. These rolls are characterized by an outer layer made of chrome-hardened copper, with the plurality of cells of the engraving being in the said copper, whereas for the ceramic anilox rolls that are the subject of this invention the plurality of cells are engraved in a non-conductive ceramic layer. One of said methods is disclosed by the French patent FR-1,540,970 and the American patent U.S. Pat. No. 3,931,570. It uses an low-frequency alternating magnetic field which magnetizes the ferromagnetic base material of the roll, and measures the resulting net magnetic field. This method is applied over a non-engraved area on the roll surface, and over an engraved area on the roll surface. A differential signal is then deduced, which is related to the volumetric capacity of the engraving.

Another one, described by the American patent application US-2004/118,180-A1 uses a high-frequency alternating field which generates eddy currents in the non-ferromagnetic base material, and measures the resulting inductance.

The PCT application WO-2010/055,320-A1 measures the capacity of the roll outer layer by means of two electrodes applied at a distance on the roll surface, with an alternative electric field between them.

These four patents (FR-1,540,970, U.S. Pat. No. 3,931,570, US-2004/118,180-A1, WO-2010/055,320-A1) have in common that they measure metallic-coated rolls that are used in the rotogravure printing process: these rolls are characterized by an outer layer made of chrome-hardened copper, with the plurality of cells of the engraving being in the said copper. The said outer layer is thus conductive, which is essential for the methods described in these patents to work: they use the property that the plurality of cells of the engraving, which are formed in a metallic layer, alters the electro-magnetic properties of the said metallic layer.

The methods described in the said four patents are therefore not applicable to the anilox rolls that are mainly used in the flexographic printing process, due to the fact that the outer layer of these rolls is made of chrome oxide ceramic, the said outer layer being highly electrically non-conductive and non-ferromagnetic. Therefore, no electro-magnetic signal can be generated in the coating that contains the engraving, and thus the methods described in the said four patents are not dependent on the volumetric capacity of the anilox roll that has to be measured, which makes them not applicable to ceramic-coated anilox rolls.

The present invention avoids the necessity to apply a precisely calibrated amount of liquid in the roll engraving, as needed in the five patents U.S. Pat. No. 4,628,728A, U.S. Pat. No. 5,235,851, DE-101,54,348-A1, U.S. Pat. No. 5,438,864, and JP-7,148,914-A. The present invention uses any quantity of liquid, or in other words a quantity of liquid that is not calibrated. This represents a significant improvement, considering the difficulty to precisely sample a quantity of liquid in the microliter range as needed in the five said patents. The present invention uses a liquid that contains nanometer-scale ferromagnetic particles, whereas the said five patents use non-ferromagnetic liquids.

The present invention uses an alternating magnetic field in order to measure the surface density of said ferromagnetic particles, from which the volumetric capacity of the engraving is deduced. It is thus a concentration of ferromagnetic particles that is measured. The four said patents, in contrast, measure the ferromagnetic properties of a metallic outer coating, and do not make use of a liquid with ferromagnetic particles.

The particular parameter setting of the oscillating magnetic field for the measurement of the ferromagnetic particle surface density has to be specifically matched with the characteristics of anilox rolls in order to yield a precise and reproducible measurement, as will be described in the next chapters. Users of anilox rolls normally do not use apparatus working with an oscillating magnetic field, nor are they using liquids containing ferromagnetic particles, which underline the novelty of the present invention. The combination of a textured ceramic coating with a liquid containing ferromagnetic particles, probed by a magnetic field, has to our knowledge never been proposed.

DISCLOSURE OF INVENTION

The process of the invention offers a new technology for the measurement of the volumetric capacity of a textured surface, as defined beneath, characterized in that a ferrofluid is applied in the cells that compose the anilox roll surface, a magnetic field is generated close to the roll surface, the intensity of the said magnetic field, increased by the ferrofluid, is measured and the volumetric capacity of the anilox roll is determined by measuring the increase in the said magnetic field due to the presence of the ferrofluid.

The device of the invention is characterized in that it comprises means for applying a ferrofluid in the cells that compose the anilox roll surface, magnetic means for generating a magnetic field close to the roll surface, measuring means for measuring the intensity of the said magnetic field, increased by the ferrofluid, and means for determining the volumetric capacity of the anilox roll by measuring the increase in the said magnetic field due to the presence of the ferrofluid.

BRIEF DESCRIPTION OF DRAWINGS

The invention will now be described, by way of examples, with reference to the accompanying drawings, in which.

MODE FOR CARRYING OUT THE INVENTION

The present invention makes use of a ferrofluid combined with a magnetic field to sense the anilox roll outer structure, and deduce its volumetric capacity. A ferrofluid is composed of ferromagnetic particles that are typically 10 nanometers in size, and which have the magnetic moments that are single-domain. In order to prevent the agglomeration of the said particles due to the attracting magnetic forces between their magnetic moments, a surfactant is applied on the particles surface, said surfactant being responsible of repelling the particles from each other through van der Weals forces. A carrier liquid, which can typically be water or a hydrocarbon solvent, e.g. kerosene, contains the particles and contributes to the correct rheology of the ferrofluid, e.g. viscosity and surface tension. A small quantity of ferrofuid, e.g. 20 microliter, is applied on the roll surface, and spread with a steel blade so that the ferrofluid fills completely the cells up to their top. The area of the spread area should be bigger than 0.1 cm², so that it is large enough to be sensed by the magnetic field.

Figure 1:
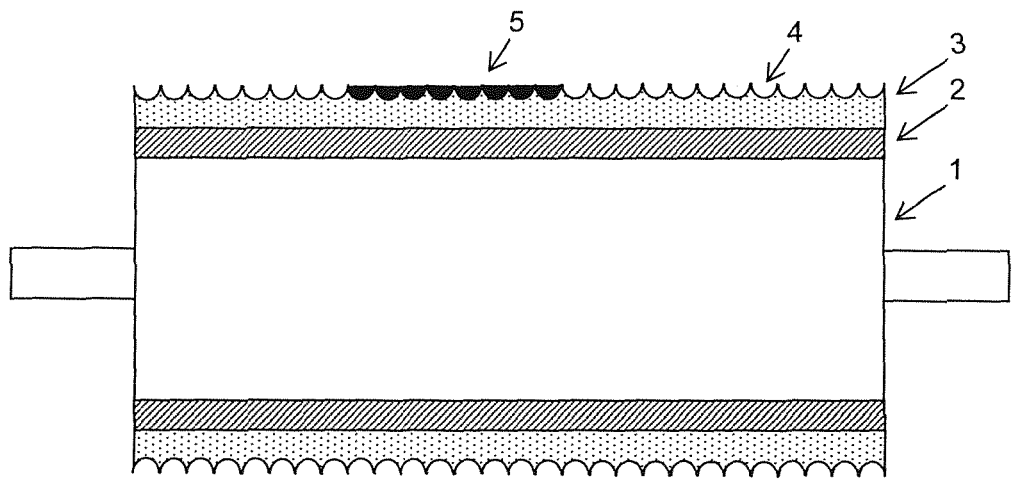
FIG. 1 is a axial cut view of an anilox roll showing the profile of the roll body used for the measurement of the volumetric capacity of the textured surface therefrom, according the method of the present invention.

FIG. 1 shows the profile of a printing roll, typically an anilox roll, which is usually composed of body 1 of steel or aluminum, on which an anticorrosion coating 2 has been applied, on which a ceramic coating 3 has been applied, in which a plurality of cells 4 has been formed, usually with a focused laser beam. A ferrofluid shall be spread in such a way that the said fluid fills a part 5 of the cells 4 precisely to their top. To this end the ferrofluid should have a not too high viscosity and a not too high surface tension in order to reach the bottom of the cells, and it should not evaporate too quickly.

Figure 2:
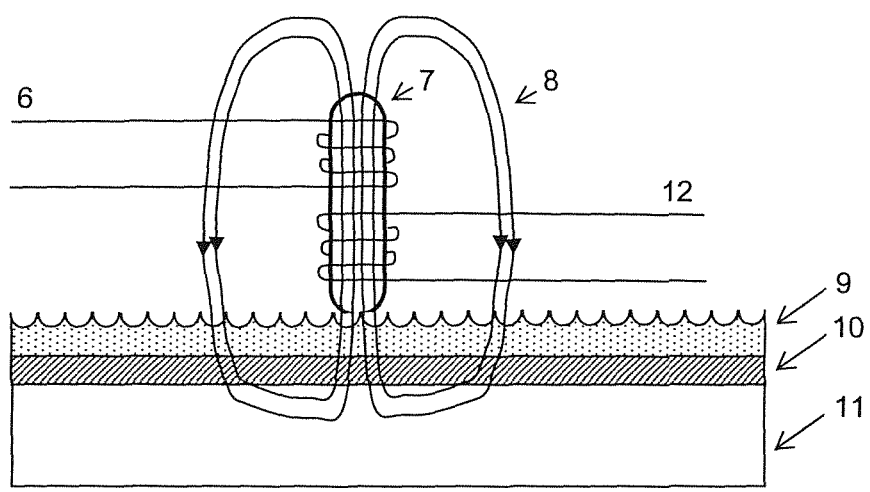
FIG. 2 illustrates the magnetic induction method for the measurement of the volumetric capacity of said textured surface.

Below are exposed three possible ways to generate a magnetic field towards the roll surface, and detect the response of the roll outer structure to this magnetic field:

A first way is shown by FIG. 2 which illustrates a so-called "magnetic induction method". An alternative current passes through a wire 6, which is wound around a soft ferromagnetic core 7, thus resulting in an oscillating magnetic field 8 directed towards the surface of the anilox roll. The said current is typically set at a low frequency which lies in the range 100-1000 Hz. The magnetic field 8 passes through the ceramic coating layer 9, the anticorrosion coating layer 20, and the base material of the roll body 11, which is typically much thicker than the said ceramic and anticorrosion layers. The magnetic field 8 is modified in case the base material is made of ferromagnetic material, and/or there is a presence of ferrofluid in the cells, resulting in a net magnetic field. The net magnetic field induces a current in the wire 12, which is also wound around the ferromagnetic core 7. The said current in the wire 12 is measured. This current depends on the thickness of the layers 9 and 10, the magnetic permeability of the base material of the roll body 11, and the presence of ferrofluid in the cells.

Figure 3:
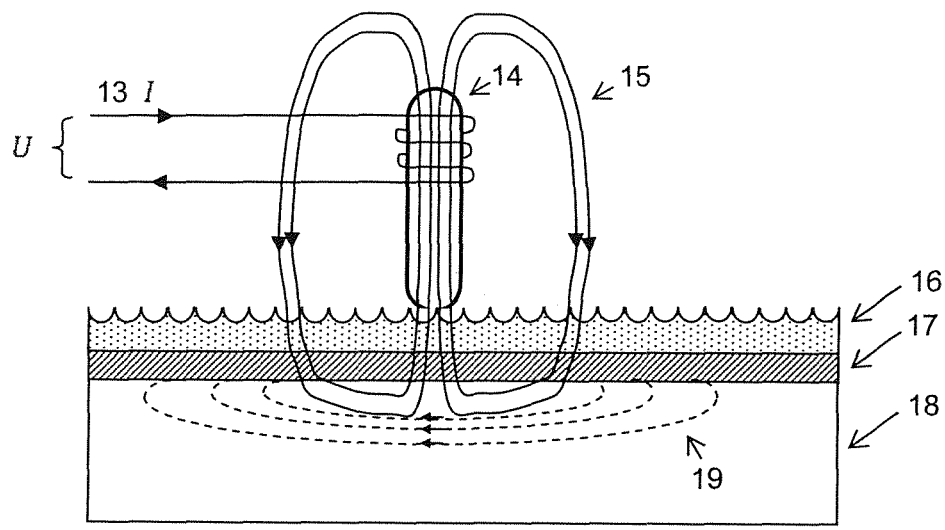
FIG. 3 illustrates the eddy current method for the measurement of the volumetric capacity of said textured surface.

FIG. 3 illustrates the eddy current method in which an alternative current I passes through a wire 13, which is wound around a soft ferromagnetic core 14, thus resulting in an oscillating magnetic field 15 directed towards surface of the roll. The current I is typically set at a high frequency which lies in the range 100 kHz to 100 MHz. The magnetic field 15 passes through the ceramic layer 16, the anticorrosion layer 17, and the base material of the roll body 18, which is typically much thicker than the said ceramic and anticorrosion layers. The eddy current method works only when the base material is electrically conductive, which is usually the case for anilox rolls. The magnetic field 15 induces eddy currents 19 in the base material, in a plane that is perpendicular to the said magnetic field, and in a direction opposite to the direction of the current/around the core 14. Due to the fact that the magnetic field 15 oscillates at a high frequency the eddy currents 19 are strong enough to provoke an induced voltage around the core 14, said voltage being measurable: by measuring the current I and the voltage U between the two ends of the wire 13, the impedance of the circuit is deduced. The said impedance is mainly dependent on the thickness of the layers 16 and 17, the electrical conductivity of the base material of the roll body 18, and the presence of ferrofluid in the cells.

Figure 4:
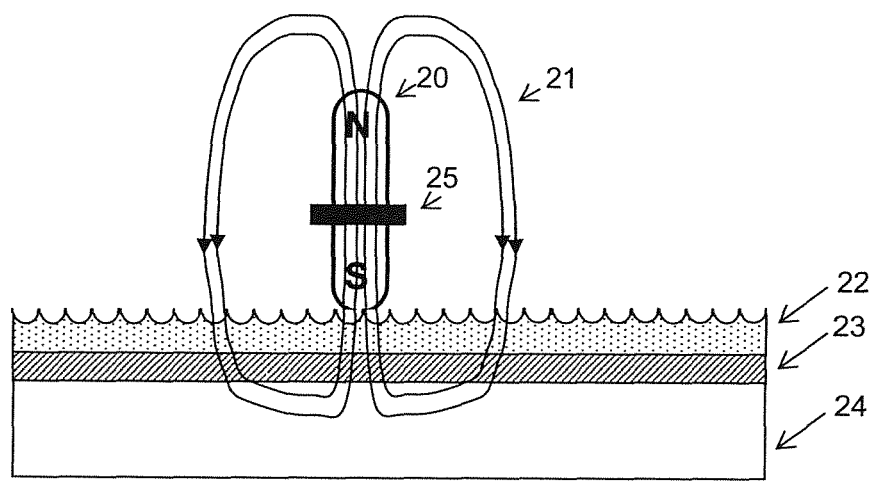
FIG. 4 illustrates the permanent magnet method for the measurement of the volumetric capacity of said textured surface, according to the present invention.

FIG. 4 illustrates another method called permanent magnet method. A permanent magnet 20 generates a static magnetic field 21. The said magnetic field passes through the ceramic layer 22, the anticorrosion layer 23, and the base material of the roll body 24, which is typically much thicker than the said ceramic and anticorrosion layers. The magnetic field 21 is modified in case the base material is made of ferromagnetic material, and/or there is a presence of ferrofluid in the cells, resulting in a net magnetic field which is measured with the Hall sensor 25. The said net magnetic field depends on the thickness of the layers 22 and 23, the magnetic permeability of the base material of the roll body 24, and the presence of ferrofluid in the cells.

Other methods than those exposed above may be used in order to generate a magnetic field towards the roll surface, and measure the effect of this magnetic field.

The present invention is not limited to a specific method to generate this magnetic field, nor on any method to measure it. When the ferrofluid is applied in the cells, as illustrated in FIG. 1, the intensity of the magnetic field (named B) is increased due to the permanent moments of the ferromagnetic particles of the fluid that align with the magnetic field. This change in the magnetic field (named δB) is measured, e.g. by one of the three methods exposed above. δB is related to the volume of ferrofluid: the more ferrofluid the bigger δB. As the ferrofluid exactly fills the cells, there is the same kind of dependency between δB and the volumetric capacity of the anilox roll.

Figure 5:
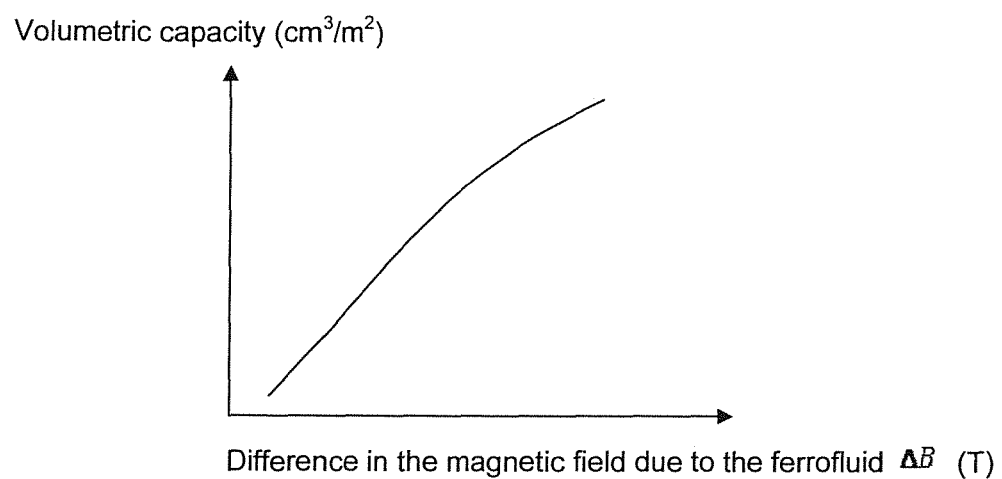
FIG. 5 is a graph of volumetric capacity versus the difference in the magnetic field due to the ferrofluid.

In one embodiment of the present invention, a first $B_1$, is done over a portion of the roll surface without ferrofluid, and a second measurement of B, noted $B_2$, is done over a portion of the roll with the ferrofluid applied in the cells. The difference in magnetic field $\Delta B$ is obtained with the relation $\Delta B = |B_2 - B_1|$. The function that relates $\Delta B$ with the volumetric capacity of the roll may be established with anilox rolls containing cells with a known volume. One such function is schematically depicted in FIG. 5 representing a curve A defining the volumetric capacity $V_c$ related to the difference of the magnetic field $\Delta B$ due to the ferrofluid.

The invention claimed is:

1. A method for the measurement of the volumetric capacity of a non-conductive and non-ferromagnetic textured surface comprising a plurality of cells designed to receive a predetermined quantity of a liquid to be transferred onto the surface of a support, wherein a ferrofluid is applied in the cells of the textured surface, a magnetic field is generated close to the textured surface, the intensity of the magnetic field, increased by the ferrofluid, is measured and the volumetric capacity of the textured surface is determined by measuring the increase in the magnetic field due to the presence of the ferrofluid.

2. The method of claim 1, wherein the textured surface is a textured surface of a ceramic-coated anilox roll.

3. The method of claim 2, wherein the surface of a support is a surface of another roll or a surface of a substrate.

4. The method of claim 3, wherein the anilox roll is adapted for use in a flexographic printing process.

5. The method according to claim 1, wherein the magnetic field is generated with a slowly oscillating current flowing in a solenoid wound over a ferromagnetic core located close to the textured surface.

6. The method according to claim 5, wherein a second solenoid is wound over the ferromagnetic core for measuring the net magnetic field.

7. The method according to claim 5, wherein the oscillating current has a frequency in the range of 10 to 1000 Hz.

8. The method according to claim 1, wherein the magnetic field is generated with a rapidly oscillating current flowing in a solenoid wound over a ferromagnetic core located close to the textured surface.

9. The method according to claim 8, wherein the magnetic field is determined by measuring the inductance of the solenoid.

10. The method according to claim 8, wherein the oscillating current has a frequency in the range of 100 kHz to 100 MHz.

11. The method according to claim 1, wherein the magnetic field is generated by a permanent magnet located close to the textured surface.

12. The method according to claim 11, wherein the magnetic field is measured by a Hall sensor.

13. The method according to claim 1, wherein the ferrofluid is spread with a thin blade.

14. The method according to claim 13, wherein the thin blade has a thickness in the range of 0.1 to 0.3 mm.

15. The device for performing the method for the measurement of the volumetric capacity of a non-conductive and non-ferromagnetic textured surface according to claim 1, wherein the device comprises means for applying a ferrofluid in the cells of the textured surface, magnetic means for generating a magnetic field close to the roll surface, measuring means for measuring the intensity of the magnetic field, increased by the ferrofluid, and means for determining the volumetric capacity of the anilox roll by measuring the increase in the magnetic field due to the presence of the ferrofluid.

16. The device according to claim 15, wherein the magnetic means for generating a magnetic field comprise a solenoid wound over a ferromagnetic core located close to the textured surface.

17. The device according to claim 16, wherein the measuring means for measuring the intensity of the magnetic field, increased by the ferrofluid comprise a second solenoid wound over the ferromagnetic core for measuring the net magnetic field.

18. The device according to claim 15, wherein the magnetic means for generating a magnetic field comprise a permanent magnet located close to the textured surface.

19. The device according to claim 15, wherein the measuring means for measuring the intensity of the magnetic field, increased by the ferrofluid, comprise a Hall sensor.

* * * * *